(12) United States Patent
Cardona et al.

(10) Patent No.: US 12,075,700 B2
(45) Date of Patent: Aug. 27, 2024

(54) TRANSVERSELY-EXCITED FILM BULK ACOUSTIC RESONATOR FABRICATION USING POLYSILICON PILLARS

(71) Applicant: Murata Manufacturing Co., Ltd., Nagaokakyo (JP)

(72) Inventors: Albert Cardona, Santa Barbara, CA (US); Andrew Kay, Provo, UT (US); Chris O'Brien, San Diego, CA (US)

(73) Assignee: MURATA MANUFACTURING CO., LTD., Nagaokakyo (JP)

(\*) Notice: Subject to any disclaimer, the term of this patent is extended or adjusted under 35 U.S.C. 154(b) by 298 days.

(21) Appl. No.: 17/542,047

(22) Filed: Dec. 3, 2021

(65) Prior Publication Data

US 2022/0359813 A1 Nov. 10, 2022

Related U.S. Application Data

(60) Provisional application No. 63/185,462, filed on May 7, 2021.

(51) Int. Cl.
*H01L 41/31* (2013.01)
*H10N 30/06* (2023.01)
*H10N 30/07* (2023.01)

(52) U.S. Cl.
CPC ............. *H10N 30/07* (2023.02); *H10N 30/06* (2023.02)

(58) Field of Classification Search
None
See application file for complete search history.

(56) References Cited

U.S. PATENT DOCUMENTS

| | | | |
|---|---|---|---|
| 5,189,777 A | 3/1993 | Guckel et al. |
| 5,274,345 A | 12/1993 | Gau |
| 5,446,330 A | 8/1995 | Eda et al. |
| 5,552,655 A | 9/1996 | Stokes et al. |
| 5,726,610 A | 3/1998 | Allen et al. |
| 5,853,601 A | 12/1998 | Krishaswamy et al. |
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |

FOREIGN PATENT DOCUMENTS

| | | |
|---|---|---|
| GB | 2578958 A | 6/2020 |
| WO | 2016017104 | 2/2016 |
| WO | 2018003273 | 1/2018 |

OTHER PUBLICATIONS

World Intellectual Property Organization, International Search Report and Written Opinion for International Application No. PCT/US22/27796, mail date Aug. 17, 2022, 12 total pages.

(Continued)

*Primary Examiner* — Shamim Ahmed
(74) *Attorney, Agent, or Firm* — ArentFox Schiff LLP

(57) ABSTRACT

An acoustic resonator device is formed using sacrificial polysilicon pillar by forming a polysilicon pillar on a substrate and depositing a dielectric layer to bury the polysilicon pillar and planarizing the surface of the dielectric layer. A piezoelectric plate is bonded to the planarized surface of the dielectric layer and thinned to a target piezoelectric membrane thickness. At least one conductor pattern is formed on the thinned piezoelectric plate and the polysilicon pillar is then removed using an etchant introduced through holes in the piezoelectric plate to form an air cavity where the pillar was removed.

20 Claims, 9 Drawing Sheets

(56) References Cited

U.S. PATENT DOCUMENTS

| | | |
|---|---|---|
| 6,707,229 B1 | 3/2004 | Martin |
| 6,710,514 B2 | 3/2004 | Ikada et al. |
| 6,833,774 B2 | 12/2004 | Abbott et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,148,121 B2 | 9/2015 | Inoue |
| 9,219,466 B2 | 12/2015 | Meltaus et al. |
| 9,276,557 B1 | 3/2016 | Nordquist et al. |
| 9,369,105 B1 | 6/2016 | Li et al. |
| 9,425,765 B2 | 8/2016 | Rinaldi et al. |
| 9,525,398 B1 | 12/2016 | Olsson et al. |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,812,048 B2 | 10/2020 | Nosaka |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 2002/0079986 A1 | 6/2002 | Ruby et al. |
| 2002/0130736 A1 | 9/2002 | Mukai |
| 2002/0158714 A1 | 10/2002 | Kaitila et al. |
| 2002/0189062 A1 | 12/2002 | Lin et al. |
| 2003/0080831 A1 | 5/2003 | Naumenko et al. |
| 2003/0199105 A1 | 10/2003 | Kub et al. |
| 2004/0100164 A1 | 5/2004 | Murata |
| 2004/0261250 A1 | 12/2004 | Kadota et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0152107 A1 | 7/2006 | Tanaka |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0122020 A1* | 5/2008 | Metz ............... H01L 21/56 438/51 |
| 2008/0246559 A1 | 10/2008 | Ayazi |
| 2010/0064492 A1 | 3/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto et al. |
| 2011/0278993 A1 | 11/2011 | Iwamoto |
| 2012/0286900 A1 | 11/2012 | Kadota et al. |
| 2012/0326809 A1 | 12/2012 | Tsuda |
| 2013/0127551 A1 | 5/2013 | Yamanaka |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0087187 A1 | 3/2016 | Burak |
| 2016/0182009 A1* | 6/2016 | Bhattacharjee .... H03H 9/02574 310/313 R |
| 2017/0063332 A1 | 3/2017 | Gilbert et al. |
| 2017/0179225 A1 | 6/2017 | Kishimoto |
| 2017/0179928 A1 | 6/2017 | Raihn et al. |
| 2017/0214381 A1 | 7/2017 | Bhattacharjee |
| 2017/0214387 A1* | 7/2017 | Burak ............... H03H 9/02118 |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0278227 A1 | 9/2018 | Hurwitz |
| 2019/0068164 A1 | 2/2019 | Houlden et al. |
| 2019/0123721 A1 | 4/2019 | Takamine |
| 2019/0131953 A1 | 5/2019 | Gong |
| 2019/0245509 A1 | 8/2019 | Hurwitz |
| 2019/0273480 A1 | 9/2019 | Lin et al. |
| 2019/0348966 A1 | 11/2019 | Campanella-Pineda |
| 2019/0379351 A1 | 12/2019 | Miyamoto et al. |
| 2019/0386636 A1 | 12/2019 | Plesski et al. |
| 2020/0007110 A1 | 1/2020 | Konaka et al. |
| 2020/0021272 A1 | 1/2020 | Segovia Fernandez et al. |
| 2020/0036357 A1 | 1/2020 | Mimura |
| 2020/0235719 A1 | 7/2020 | Yantchev et al. |
| 2020/0259480 A1* | 8/2020 | Pensala ............. H03H 9/02228 |
| 2020/0313645 A1 | 10/2020 | Caron |
| 2020/0350891 A1 | 11/2020 | Turner |
| 2021/0013859 A1 | 1/2021 | Turner et al. |
| 2021/0119595 A1 | 4/2021 | Turner et al. |
| 2021/0328574 A1 | 10/2021 | Garcia |

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8 Sep. 6, 2017.

(56) References Cited

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190. Mar. 00, 2014.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages. Jun. 5, 2018.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2. May 00, 2018.

Y. Yang, A. Gao et al. "5 GHZ Lithium Niobate Mems Resonators With High FOM of 153", 2017 IEEE 30th International Conference in Micro Electro Mechanical Systems (MEMS). Jan. 22-26, 2017. pp. 942-945 Jan. 22, 2017.

USPTO/ISA, International Search Report and Written Opinion for PCT Application No. PCT/US2019/036433 dated Aug. 29, 2019. Aug. 29, 2019.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406 Jan. 00, 1986.

Safari et al. "Piezoelectric for Transducer Applications" published by Elsevier Science Ltd., pp. 4 (Year: 2000). Jan. 00, 2000.

Buchanan "Ceramic Materials for Electronics" 3rd Edition, first published in 2004 by Marcel Dekker, Inc. pp. 496 (Year 2004). Jan. 00, 2004.

Moussa et al.Review on Triggered Liposomal Drug Delivery with a Focus on Ultrasound2015, Bentham Science Publishers, pp. 16 (Year 2005) Jan. 00, 2005.

Acoustic Properties of SolidsONDA Corporation592 Weddell Drive, Sunnyvale, CA 94089, Apr. 11, 2003, pp. 5 (Year 2003) Apr. 11, 2003.

Sorokin et al.Study of Microwave Acoustic Attenuation in a Multi-frequency Bulk Acoustic Resonator Based on a Synthetic Diamond Single CrystalPublished in Acoustical Physics, vol. 61, No. 6, 2015 pp. 675 (Year 2015) Jan. 00, 2015.

Material Properties of Tibtech Innovations, © 2018 TIBTECH Innovations (Year 2018) Jan. 00, 2018.

Zou, Jie "High-Performance Aluminum Nitride Lamb Wave Resonators for RF Front-End Technology" University of California, Berkeley, Summer 2015, pp. 63 (Year 2015) Jan. 00, 2015.

Bahreynl, B.Fabrication and Design of Resonant MicrodevicesAndrew William, Inc. 2018, NY (Year 2008) Jan. 00, 2008.

International Search Report and Written Opinion for PCT Application No. PCT/US2019/058632 dated Jan. 17, 2020. Jan. 17, 2020.

G. Manohar, Investigation of Various Surface Acoustic Wave Design Configurations for Improved Sensitivity, Jan. 2012, Doctoral dissertation, University of South Florida, USA Jan. 2012.

Ekeom, D. & Dubus, Bertrand & Volatier, A., Solidly mounted resonator (SMR) FEM-BEM simulation, 2006, 1474-1477, 10.1109/ULTSYM.2006.371. 2006.

Santosh, G. , Surface acoustic wave devices on silicon using patterned and thin film ZnO, Ph.D. thesis, Feb. 2016, Indian Institute of technology Guwahati, Assam, India Feb. 2016.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

USPTO/ISA, International Search Report and Written Opinion for PCT Application No. PCT/US2020/45654 dated Oct. 29, 2020. 2020.

Naumenko et al., "Optimal orientations of Lithium Niobate for resonator SAW filters", 2003 IEEE Ultrasonics Symposium—pp. 2110-2113. (Year: 2003) 2003.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

Webster Dictionary, Meaning of "diaphragm" Merriam Webster since 1828. 1828.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

\* cited by examiner

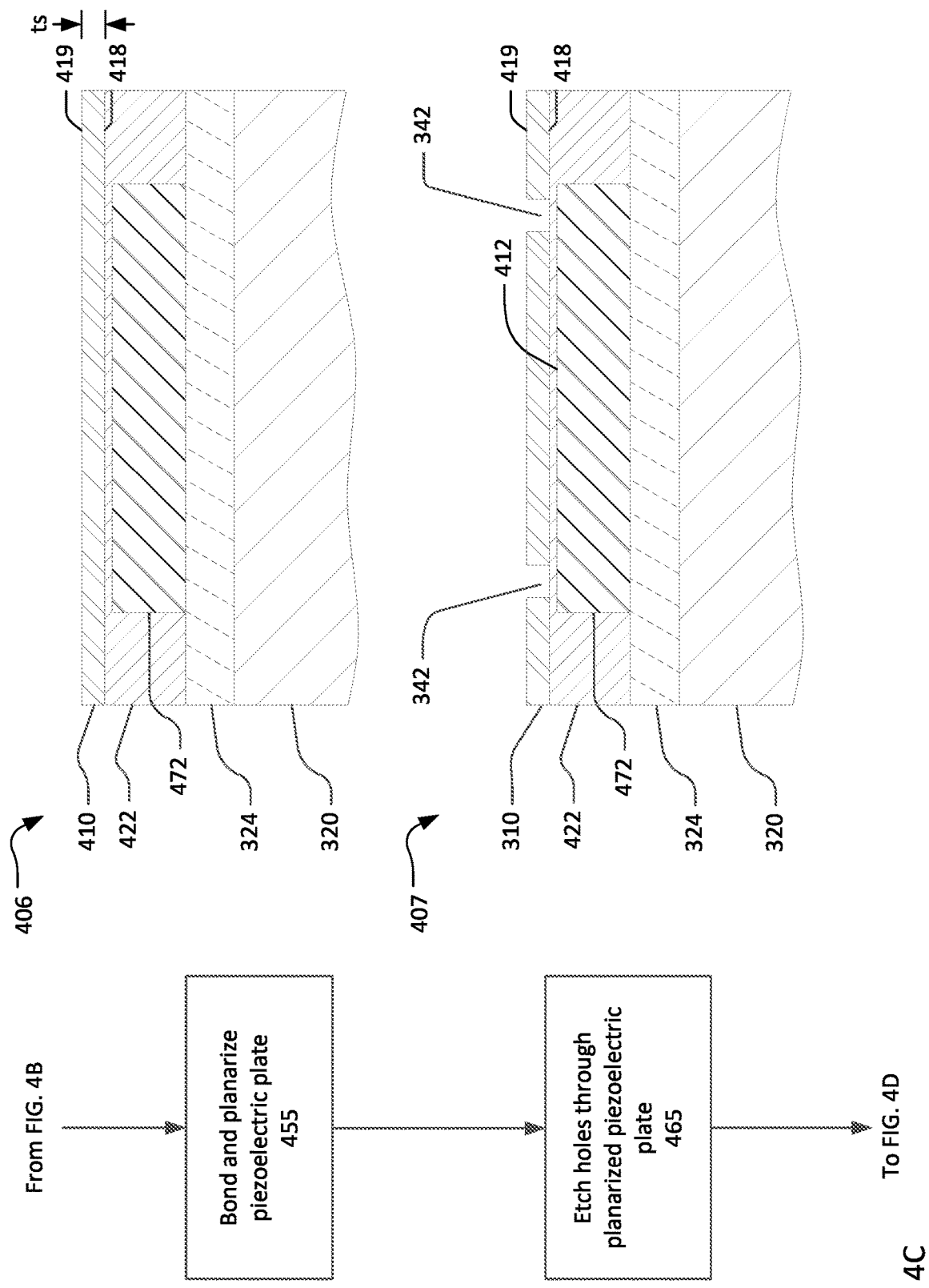

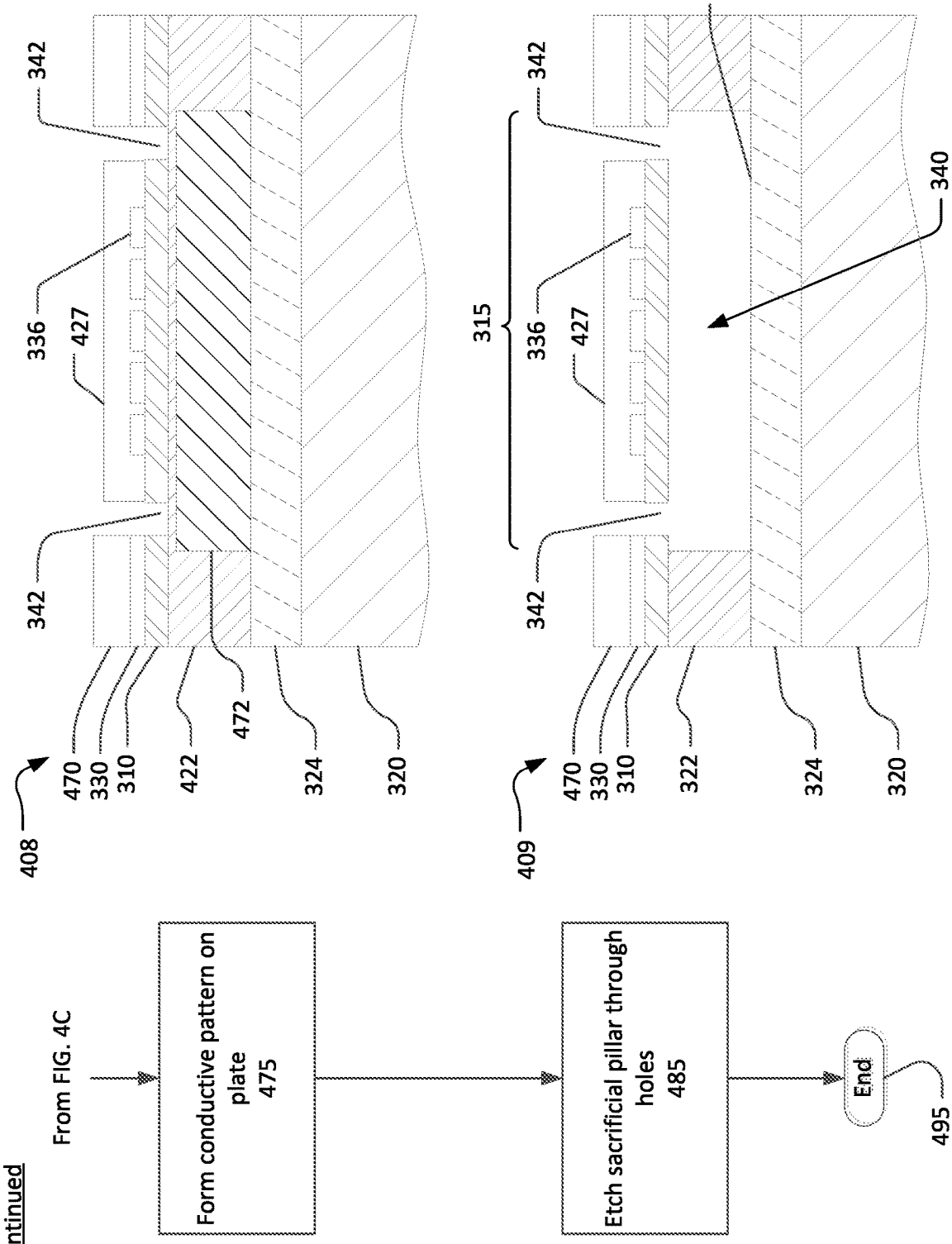

TRANSVERSELY-EXCITED FILM BULK ACOUSTIC RESONATOR FABRICATION USING POLYSILICON PILLARS

RELATED APPLICATION INFORMATION

This patent claims priority to co-pending U.S. provisional patent application No. 63/185,462, titled METHOD FOR XBAR FABRICATION USING POLYSILICON PILLARS, filed May 7, 2021.

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 1300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

DESCRIPTION OF THE DRAWINGS

FIGS. 4A, 4B, 4C and 4D (collectively "FIG. 4") are a flow chart of a process for fabricating an XBAR using polysilicon pillars.

Figure 1:
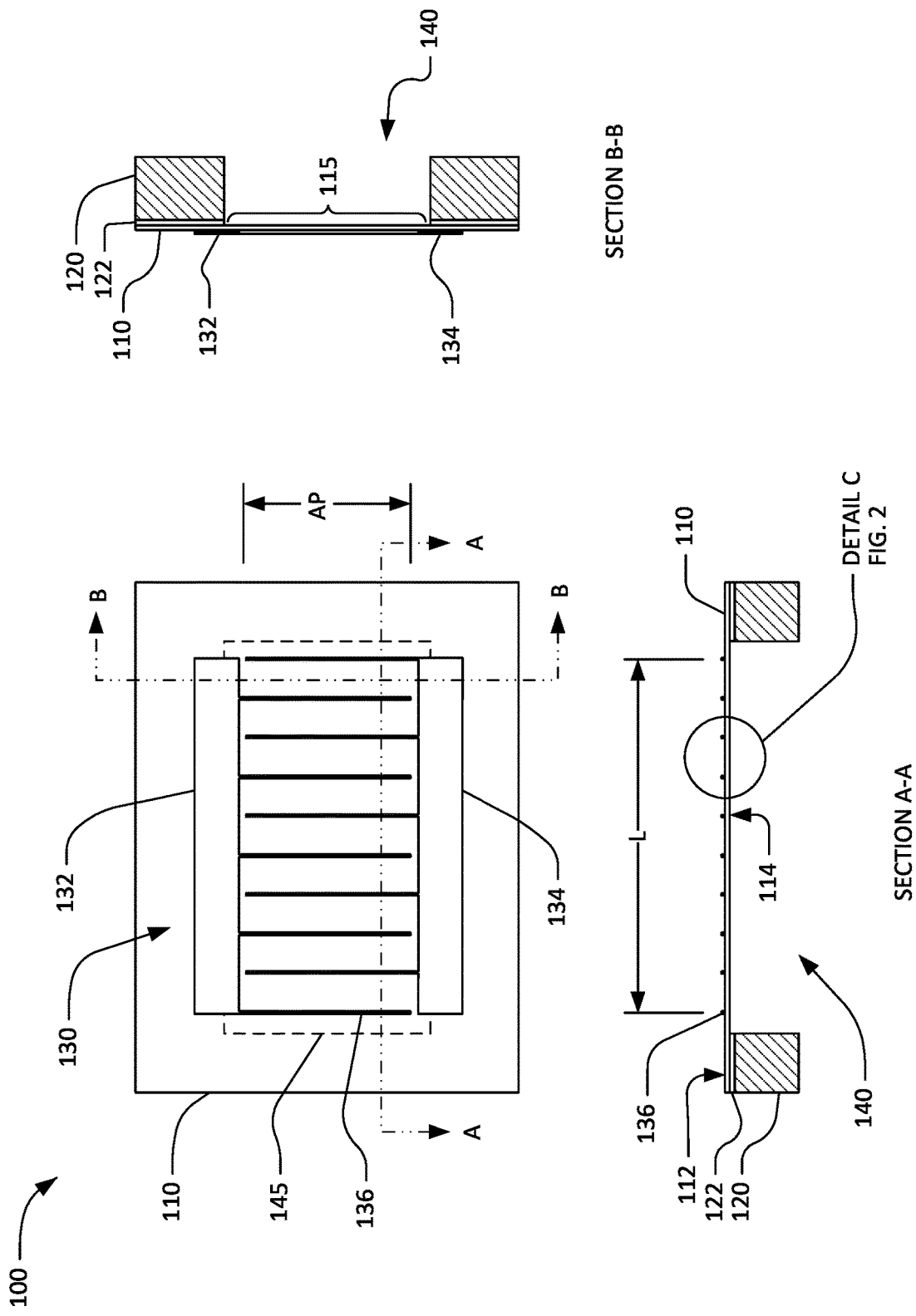
FIG. 1 includes a schematic plan view and two schematic cross-sectional views of a transversely-excited film bulk acoustic resonator (XBAR).

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator or the same two least significant digits.

DETAILED DESCRIPTION

Description of Apparatus

The Transversely-Excited Film Bulk Acoustic Resonator (XBAR) is a new resonator structure for use in microwave filters. The XBAR is described in U.S. Pat. No. 10,491,291, titled TRANSVERSELY EXCITED FILM BULK ACOUSTIC RESONATOR, which is incorporated herein by reference in its entirety. An XBAR resonator comprises a conductor pattern having an interdigital transducer (IDT) formed on a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

A piezoelectric membrane may be a part of a plate of single-crystal piezoelectric material that spans a cavity in the substrate. A piezoelectric diaphragm may be the membrane and may include the front-side and/or back-side dielectric layers. An XBAR resonator may be such a diaphragm or membrane with an interdigital transducer (IDT) formed on a diaphragm or membrane. Contact pads can be formed at selected locations over the surface of the substrate to provide electrical connections between the IDT and contact bumps to be attached to or formed on the contact pads.

XBAR fabrication processes herein may be divided into two broad categories known as "the front-side etch option" and the "backside etch option". With the front-side etch option, the piezoelectric plate is attached to a substrate and the active portion of the piezoelectric plate floats over a cavity (the "swimming pool") formed by etching away a tub (e.g., a thickness of an area like a bathtub) of the sacrificial material using an etchant introduced through holes in the piezoelectric plate. With the backside etch option, the piezoelectric plate is attached to a substrate and the active portion of the piezoelectric plate floats over a void etched completely through an area of the substrate and the sacrificial tub from the back side (i.e., the side opposite the piezoelectric plate). The void forms a cavity under the plate.

The following describes improved XBAR resonators, filters and fabrication techniques for XBAR resonators that are fabricated using polysilicon pillars. This can be done by forming a polysilicon pillar on a substrate, burying the pillar under a dielectric layer that is then planarized, bonding a piezoelectric plate to the planarized surface of the dielectric layer, thinning the plate to a target membrane thickness, forming a conductor pattern on the piezoelectric plate, then removing the polysilicon pillar with an etchant introduced through holes in the piezoelectric plate. The pillar may be a sacrificial polysilicon pillar or tub formed on a silicon carrier substrate that is removed by front-side etching through openings in the piezoelectric plate to form an air cavity where the polysilicon pillar is removed and to frontside release a piezoelectric membrane of the plate to form a diaphragm over the etched air cavity.

These improvements avoid the backside etch options or backside membrane release (BSMR) methods that typically use a deep reactive ion etching (DRIE) technique to remove the Si substrate underneath a LN piezoelectric plate and the etching time increases with Si substrate thickness. Instead, the technology herein use a frontside membrane release (FSMR) etch processing which takes less etchant and time.

Also, other FSMR techniques require: 1) sacrificial material deposited in an already formed cavity area, the sacrificial material which will need to be etched away at a later process step, and 2) a buried oxide layer formed prior to the sacrificial material to form an adhesion layer between the LN substrate and Si substrate. On the other hand, the polysilicon pillar method of uses a sacrificial cavity pillar material formed on the substrate prior to forming the oxide adhesion layer for the FSMR process. Other FSMR techniques would etch a recess (that will become the cavity) in the substrate, deposit a sacrificial material, planarize the surface to remove all sacrificial material except the material filling the recess, bond the piezoelectric plate and proceed. On the other hand, using the polysilicon pillar provides much better control of the cavity shape in about the same number of steps as the other techniques.

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented, the piezoelectric plates may be Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, glass, sapphire, quartz, or some other material. The substrate may have layers of silicon thermal oxide (TOX), silicon dioxide and/or crystalline silicon. The back surface 114 of the piezoelectric plate 110 may be bonded to the substrate 120 using a wafer bonding process, or grown on the substrate 120, or attached to the substrate in some other manner. The piezoelectric plate is attached directly to the substrate or may be attached to the substrate via a bonding oxide layer 122, such as a bonding oxide (BOX) layer of SiO2, or another oxide such as Al2O3.

As shown in FIG. 1, the diaphragm 115 is contiguous with the rest of the piezoelectric plate 110 around all of a perimeter 145 of the cavity 1. In this context, "contiguous" means "continuously connected without any intervening item". However, it is possible for a bonding oxide layer (BOX) to bond the plate 110 to the substrate 120. The BOX layer may exist between the plate and substrate around perimeter 145 and may extend further away from the cavity than just within the perimeter itself. In the absence of a process to remove it the BOX is everywhere between the piezoelectric plate and the substrate. The BOX may be removed from the back of the diaphragm 115 as part of forming the cavity.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The IDT 130 is positioned on the piezoelectric plate 110 such that at least the fingers 136 of the IDT 130 are disposed on the diaphragm 115 of the piezoelectric plate that spans, or is suspended over, the cavity 140. The interleaved fingers 136 overlap for a distance AP, commonly referred to as the "aperture" of the IDT. The center-to-center distance L between the outermost fingers of the IDT 130 is the "length" of the IDT.

The first and second busbars 132, 134 serve as the terminals or electrodes of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120 or the bottom of the cavity. "Cavity" has its conventional meaning of "an empty space within a solid body." The cavity may contain a gas, air, or a vacuum. In some case, there is also a second substrate, package or other material having a cavity (not shown) above the plate 110, which may be a mirror image of substrate 120 and cavity 140. The cavity above plate 110 may have an empty space depth greater than that of cavity 140. The fingers extend over (and part of the busbars may optionally extend over) the cavity (or between the cavities). The cavity 140 may be a hole completely through the substrate 120 (as shown in Section A-A and Section B-B of FIG. 1) or a recess in the substrate 120 (as shown subsequently in FIG. 3A). The cavity 140 may be formed, for example, by selective etching of the substrate 120 before or after the piezoelectric plate 110 and the substrate 120 are attached. The cavity may be formed by etching one or more layers of: electrically insulating material, sacrificial pillar material and/or a silicon dioxide material. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter of the cavity 140. In this context, "contiguous" means "continuously connected without any intervening item". In some cases, a BOX layer may bond the plate 110 to the substrate 120 around the perimeter.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
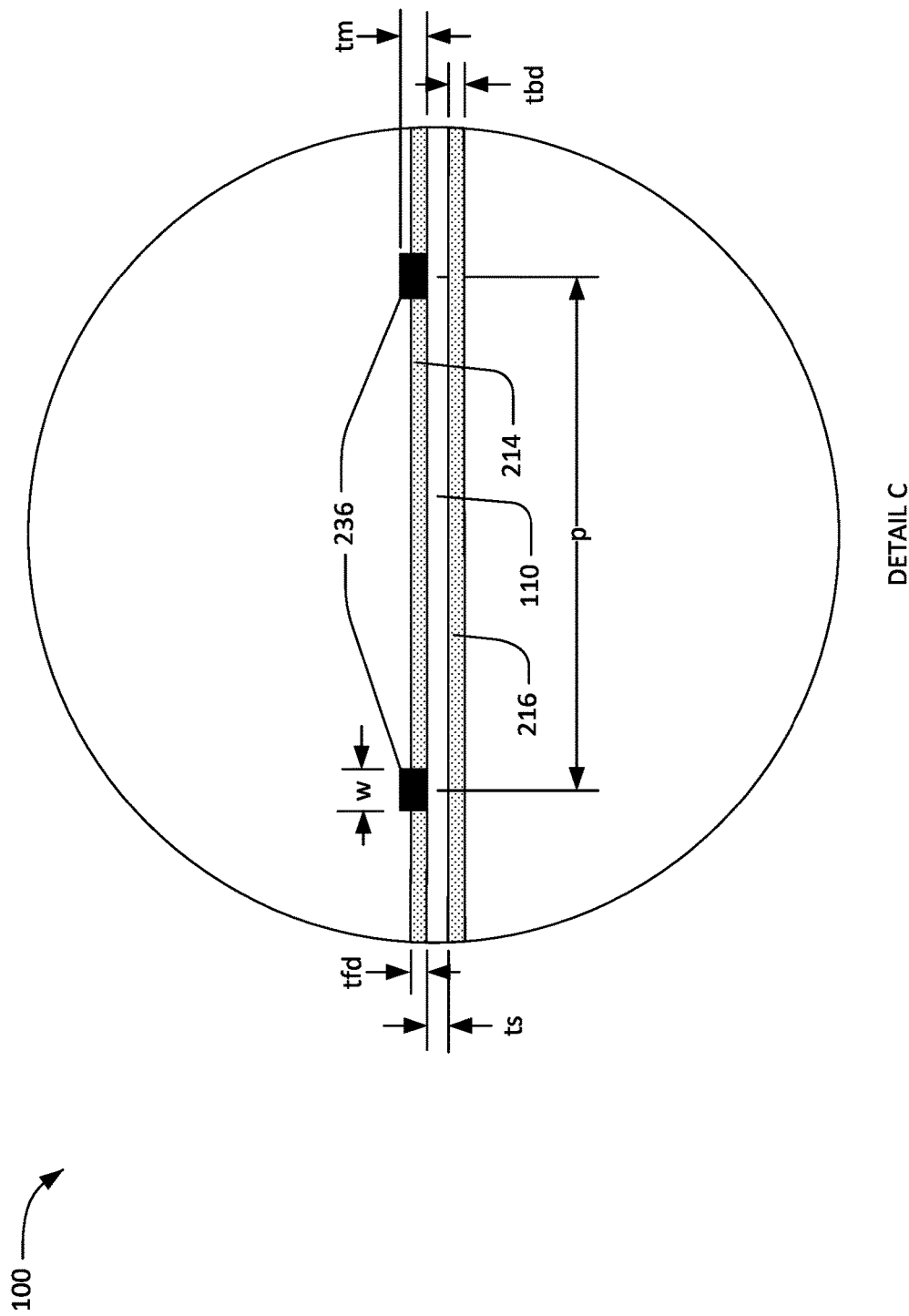
FIG. 2 is an expanded schematic cross-sectional view of a portion of the XBAR of FIG. 1.

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. The ts may be, for example, 100 nm to 1500 nm. When used in filters for LTE™ bands from 3.4 GHZ to 6 GHz (e.g., bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 236. Although not shown in FIG. 2, the front side dielectric layer 214 may also be deposited over the IDT fingers 236. A back-side dielectric layer 216 may optionally be formed on the back side of the piezoelectric plate 110. The back-side dielectric layer may be or include the BOX layer. The back-side dielectric layer 216 has a thickness tbd. The front-side and back-side dielectric layers 214, 216 may be a non-piezoelectric dielectric material, such as silicon dioxide or silicon nitride. The tfd and tbd may be, for example, 0 to 500 nm. tfd and tbd are typically less than the thickness ts of the piezoelectric plate. The tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric layer.

Further, a passivation layer may be formed over the entire surface of the XBAR device 100 except for contact pads where electric connections are made to circuitry external to the XBAR device. The passivation layer is a thin dielectric layer intended to seal and protect the surfaces of the XBAR device while the XBAR device is incorporated into a package. The front side dielectric layer, backside dielectric, BOX layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal conductors from water and chemical corrosion, particularly for power durability purposes. It may range from 10 to 100 nm. The passivation material may consist of multiple oxide and/or nitride coatings such as SiO2 and Si3N4 material.

The IDT fingers 236 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
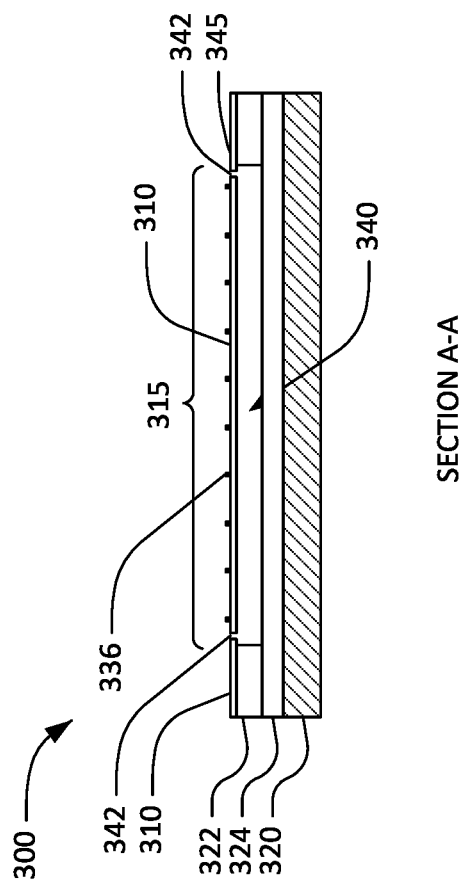
FIG. 3A is an alternative schematic cross-sectional view of an XBAR.

FIG. 3A is an alternative cross-sectional view of XBAR device 300 along the section plane A-A defined in FIG. 1. In FIG. 3A, a piezoelectric plate 310 is attached to a bonding layer 322 which is attached to thermal oxide (TOX) layer 324 which is attached to substrate 320. Although layer 324 is described as a thermal oxide, it is considered that layer 324 may be another oxide or dielectric oxide material layer, such as deposited by CVD or another process for depositing an oxide layer. Bonding layer 322 may be a silicon dioxide layer extending around the perimeter 345 of diaphragm 315 and TOX layer 324 may be a silicon TOX such as silicon dioxide. Layers 322, 324 and 320 may be attached to each other by: being chemically or atomically formed one each other; being chemically or adhesively bonded to each other. A portion of the piezoelectric plate 310 forms a diaphragm 315 spanning a cavity 340 in the substrate. The cavity 340, does not fully penetrate the substrate 320, and is formed in the substrate under the portion of the piezoelectric plate 310 containing the IDT of an XBAR. Fingers, such as finger 336, of an IDT are disposed on the diaphragm 315. Plate 310, diaphragm 315 and fingers 336 may be plate 110, diaphragm 115 and fingers 136. The cavity 340 may be formed, for example, by etching a sacrificial pillar of material formed on the TOX layer 324 with a selective etchant that reaches the pillar through one or more openings 342 provided in the piezoelectric plate 310. The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

One or more intermediate material layers (not shown) may be attached between plate 310 and bonding layer 322. An intermediary layer may be or include another bonding layer, a silicon dioxide layer, a BOX layer, an etch stop layer, a sealing layer, an adhesive layer or layer of other material that is attached or bonded to plate 310 and bonding layer 322. The intermediate material layer may be one or more of any of these layers or a combination of these layers. In other embodiments, the piezoelectric plate 310 is attached directly to the bonding layer 322 and an intermediary layer does not exist.

While the cavity 340 is shown in cross-section, it should be understood that the lateral extent of the cavity is a continuous closed band area of bonding layer 322 that surrounds and defines the size of the cavity 340 in the direction normal to the plane of the drawing. The lateral (i.e. left-right as shown in the figure) extent of the cavity 340 is defined by the lateral edges of bonding layer 322. The vertical (i.e., down from plate 310 as shown in the figure) extent or depth of the cavity 340 into the bonding layer 322 and to the top surface of the TOX layer 324. In this case, the cavity 340 has a side cross-section rectangular, or nearly rectangular, cross section.

The XBAR 300 shown in FIG. 3A will be referred to herein as a "front-side etch" configuration since the cavity 340 is etched from the front side of the substrate 320 (after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBAR 300 shows one or more openings 342 in the piezoelectric plate 310 at the left and right sides of the cavity 340. However, in some cases openings 342 in the piezoelectric plate 310 are only at the left or right side of the cavity 340.

Figure 3B:
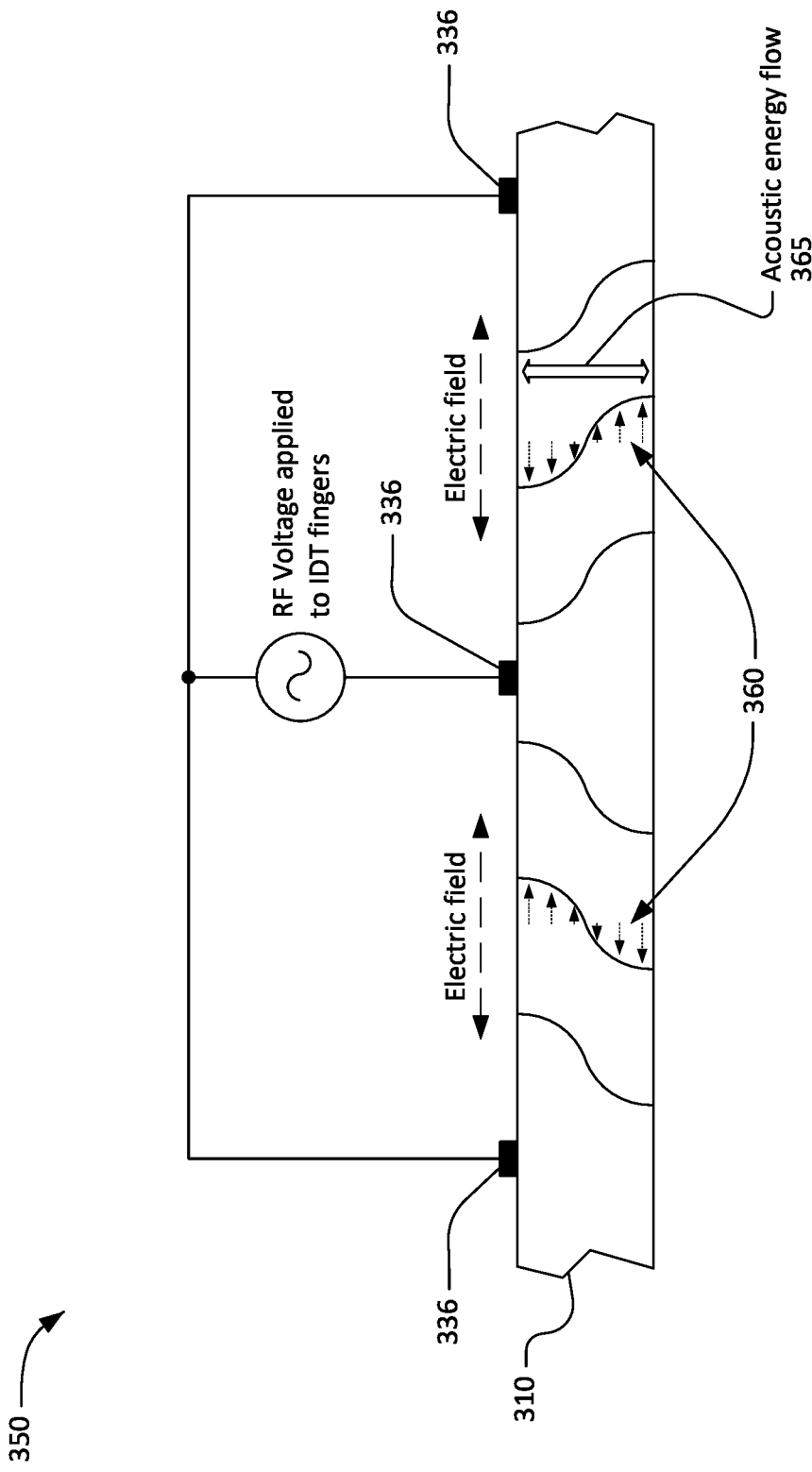
FIG. 3B is a graphical illustration of the primary acoustic mode of interest in an XBAR.

FIG. 3B is a graphical illustration of the primary acoustic mode of interest in an XBAR. FIG. 3B shows a small portion of an XBAR 350 including a piezoelectric plate 310 and three interleaved IDT fingers 336. XBAR 350 may be part of any XBAR herein. An RF voltage is applied to the interleaved fingers 336. This voltage creates a time-varying electric field between the fingers. The direction of the electric field is primarily lateral, or parallel to the surface of the piezoelectric plate 310, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 310. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 350 are represented by the curves 360, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3B), the direction of acoustic energy flow of the excited primary shear acoustic mode is substantially orthogonal to the front and back surface of the piezoelectric plate, as indicated by the arrow 365.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. The piezoelectric coupling for shear wave XBAR resonances can be high (>20%) compared to other acoustic resonators. High piezoelectric coupling enables the design and implementation of microwave and millimeter-wave filters with appreciable bandwidth.

Figure 3C:
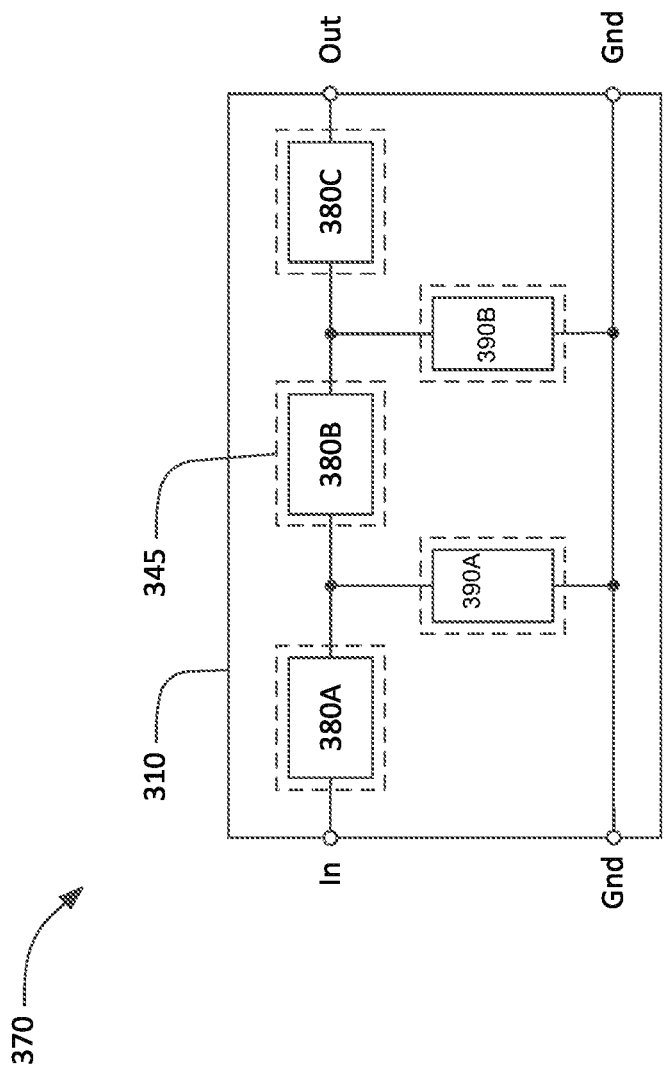
FIG. 3C is a schematic circuit diagram and layout for a high frequency band-pass filter using XBARs.

FIG. 3C is a schematic circuit diagram and layout for a high frequency band-pass filter 370 using XBARs. The filter 370 has a conventional ladder filter architecture including three series resonators 380A, 380B, 380C and two shunt resonators 390A, 390B. The three series resonators 380A, 380B, and 380C are connected in series between a first port and a second port. In FIG. 3C, the first and second ports are labeled "In" and "Out", respectively. However, the filter 370 is bidirectional and either port and serve as the input or output of the filter. The two shunt resonators 390A, 390B are connected from nodes between the series resonators to ground. All the shunt resonators and series resonators are XBARs on a single die.

The three series resonators 380A, B, C and the two shunt resonators 390A, B of the filter 370 are formed on a single plate 310 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 3C, the cavities are illustrated schematically as the dashed rectangles (such as the rectangle 345). In this example, each IDT is disposed over a respective cavity. In other filters, the IDTs of two or more resonators may be disposed over a single cavity.

Description of Methods

FIGS. 4A, 4B, 4C and 4D (collectively "FIG. 4") are a flow chart 400 of a process for fabricating an XBAR or a filter incorporating XBARs using polysilicon pillars. The process 400 includes fabrication of sacrificial polysilicon pillars 472 on silicon carrier substrates 320 for the formation of air cavities 340 using a frontside membrane release process at 485 for release of the plate when a cavity is etched in the substrate. It can be or include a process for fabricating an XBAR using a sacrificial pillar, front side etched cavities and front-side membrane release. It may include using polysilicon pillars for air cavity formation where the pillar was removed and/or for frontside membrane release. The process 400 may be or may be included in the forming of XBAR 100, 300, 350 and/or of filter 370. The flow chart of FIG. 4 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 4.

The process 400 starts at 411 with obtaining or receiving a device 401 having a substrate 320 and a thermal oxide (TOX) layer 324 on the substrate. As noted above, this layer can be an oxide or dielectric that is not a thermal oxide. The process 400 ends at 495 with a completed XBAR or filter, such as device 409 which may be XBAR 100, 300, 350 and/or of filter 370.

Device 401 has a bottom surface 414 of TOX layer 324 attached to, bonded to, and/or formed on a top surface 413 of substrate 320. Substrate 320 may be a silicon carrier wafer such as of polymorphic or crystalline silicon having a thickness of 250-500 um; and TOX layer 324 may be a thickness of 1-5 um of thermal oxide such as SiO2. TOX layer 324 may be 2 um thick of silicon thermal oxide or another electrically insulating material. Device 401 may be a single substrate of crystalline silicon material that is chemically and/or thermally treated on its top surface to create the silicon TOX layer 324. The treatment may oxidize the silicon to form the TOX layer. In some cases, the substrate 320 is a wafer of other than or of not only silicon material that has the TOX upper layer. At 411, the device 401 may be received such as by being obtained or purchased from an outside source.

At 415 sacrificial layer 426 is formed on the TOX layer 324 to form device 402. Device 402 has a bottom surface of sacrificial layer 426 attached to, bonded to, and/or formed on a top surface 416 of TOX layer 324. Forming at 417 may be forming a blanket layer of sacrificial material 617 over the top of the layer 324 as shown. Forming a blanket layer may be depositing a continuous layer over the prior structure, such as laying a blanket of material over all of the prior device top surfaces. The sacrificial layer 426 may be formed by deposition such as atomic layer deposition (ALD) or chemical vapor deposition (CVD) onto surface 416. Forming at 415 may be depositing a thickness tsf of polysilicon on the TOX layer 324.

The sacrificial layer 426 can be any material that can be subsequently removed by selectively etching, dissolving, or some other process that removes the material of layer 426 with respect to the material of TOX layer 324 and layer 421 (see step 435). Sacrificial layer 426 may be a polysilicon material. Sacrificial layer 426 may have a thickness tsf of between 1 um and 5 um. The thickness tsf may be 3 um. Sacrificial layer 426 may be planarized or polished (e.g., by CMP) to have top surface 417.

At 425 the sacrificial layer 426 is patterned and etched to form sacrificial pillar 472 and device 403. Step 425 may be forming a polysilicon pillar on a substrate of step 415. The etch can use a photolithography to pattern holes in or remove areas of the sacrificial layer 426 to leave sacrificial pillar 472. At 425 a mask or photoresist (not shown) may be formed over the surface 417 and the TOX layer 324 may be use a vertical etch-stop under the layer 426. In other cases, a timed etch may be used with the mask.

In subsequent process steps, a piezoelectric plate will be bonded to the substrate and the sacrificial pillar 472 will be removed to form cavities 340 under the piezoelectric plate. The sacrificial pillar 472 can be any material that can be subsequently removed by selectively etching, dissolving, or some other process that removes sacrificial pillar 472 with respect to the material of TOX layer 324 and layer 422 (see step 445). The process will remove all or substantially all of pillar 472 without removing any or barely any of the material of TOX layer 324 or layer 421 (see step 485).

The sacrificial pillar 472 may be a sacrificial tub of the sacrificial material of layer 426. The sacrificial pillar 472 may be predefined volume in the layer 426 prior to bonding the wafer to an active piezoelectric (e.g., LiNbO3 or other material) wafer or plate (e.g., at 455). The predefined volume may have a perimeter (e.g., length and width) and thickness (e.g., depth) selected to form perimeter 345, diaphragm 315 and/or cavity 340. Using a predefined volume for sacrificial pillar 472 at 425 allows the resonator membrane size over the cavities 340 to be drastically reduced, and fabrication steps to be significantly simplified.

Figure 4A:
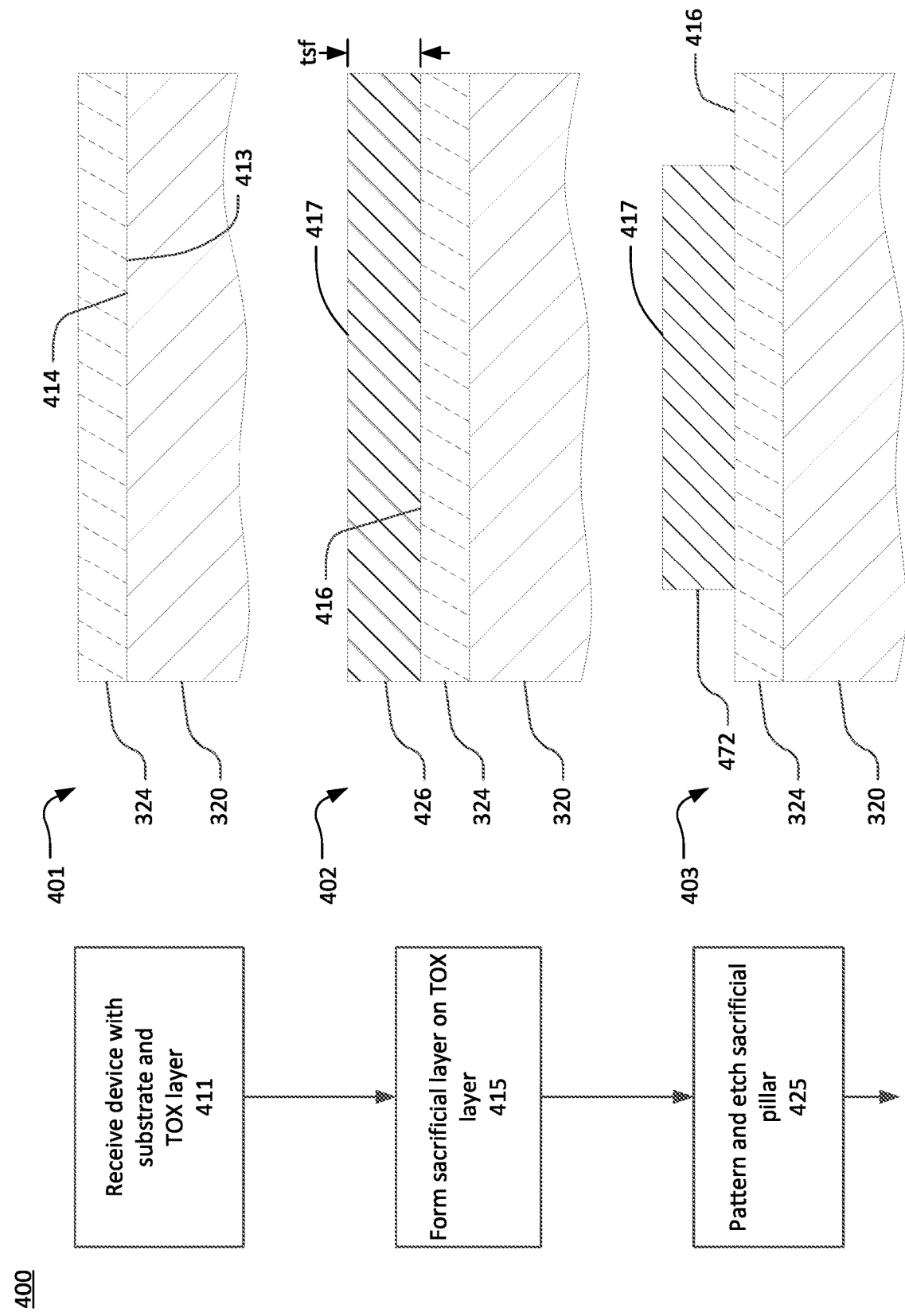
Figure 4B:
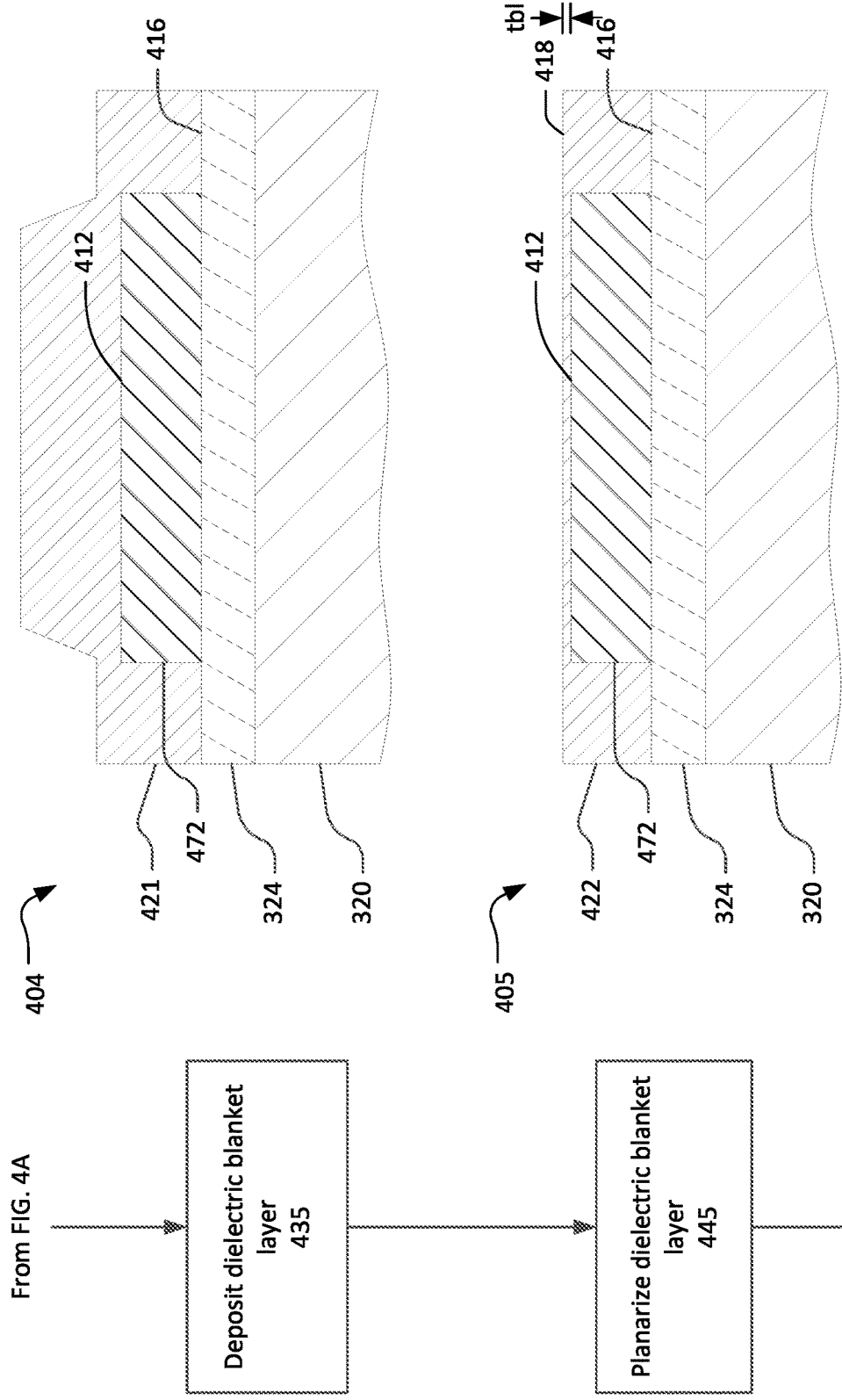

At 435 in FIG. 4B dielectric blanket layer 421 is deposited on pillar 472 and surface 416 to form device 404. Device 404 has a bottom surface of blanket layer 421 deposited and/or formed on a top surface 412 and side surfaces of pillar 472, and on a top surface 416 of TOX layer 324. Forming at 435 may be forming a blanket layer of electrically insulating material over the top surfaces as shown. The blanket layer 421 may be formed by deposition such as atomic layer deposition (ALD) or chemical vapor deposition (CVD) onto to top surfaces. Forming at 435 may be depositing, for example, a 4 um thickness of SiO2 blanket material on the exposed surfaces of pillar 472 and the TOX layer 324.

The blanket layer 421 can be any material that can be subsequently removed by selectively etching, dissolving, or some other process that removes the material of layer 421 with respect to the material plate 310 and pillar 472 (see step 485). Blanket layer 421 may be a silicon dioxide material. In other cases, it may be silicon nitride or another dielectric. Blanket layer 421 may have a thickness of between 2 um and 10 um. The thickness may be between 3-5 um. The combination of step 435 and 445 may be depositing a dielectric layer on the pillar to bury the polysilicon pillar of step 425 and planarizing the surface of the dielectric layer.

At 445 dielectric blanket layer 421 is planarized to form bonding layer 422 and device 405. Planarizing at 445 may include planarizing and/or polishing (e.g., by CMP) blanket layer 421 to have top surface 412 of layer 422. For example, after the blanket layer 421 is deposited, the surface of the material of layer 421 may be uneven or hump up over pillar 472 as shown and thus should be planarized. Planarization may be performed by mechanical polishing, by chemical-mechanical polishing (CMP), or some other method. In some cases, planarizing is CMP the material of layer 421 until the top surface of layer 422 above pillar 472 has thickness tbl. Thickness tbl may be a thickness of between 0.05 um and 1.0 um. The thickness may be between 0.1 um and 0.5 um.

In other cases, the polish may be until top surface 412 of the pillar is exposed (not shown). The surface 412 may stop removal of the blanket layer 421 by the polishing because it is polished magnitudes slower by the CMP process than that of blanket layer 421. In some cases, CMP of blanket layer 421 is performed to expose and to polish off some (e.g., less than 10 percent) of the thickness of pillar 472.

At 455 in FIG. 4C a piezoelectric plate or substrate is bonded to layer 422 and planarized to form piezoelectric plate 410 and device 406. Device 406 has planarized plate 410 bonded to top surface 418 of dielectric layer 422. Step 455 may be bonding a piezoelectric plate to the planarized surface of the dielectric layer of step 445 and thinning the piezoelectric plate of step to a target piezoelectric membrane thickness.

The piezoelectric plate that is bonded to layer 422 may be a piezoelectric substrate, of material noted for plate 110 and/or 310. The piezoelectric plate substrate may be, for example, Z-cut, rotated Z-cut, or rotated Y-cut lithium niobate or lithium tantalate. The piezoelectric plate substrate may be some other material and/or some other cut as previously noted for plate 110. The plate substrate may be an LiNbO3 (LN) substrate having a thickness between 150 um and 1000 um. It may have a thickness of 250 um.

In some cases, the piezoelectric substrate is bonded only to surface 418 of bonding layer 422 as shown, thus leaving thickness tbl of layer 422 between the top of pillar 472 and the piezoelectric substrate. In other cases, the piezoelectric substrate is bonded to surface 418 of bonding layer 422 and to the top surface 412 of pillar 472 (not shown). This does not leave any thickness of layer 422 between the top of pillar 472 and the piezoelectric substrate. In this case, the bonding layer 422 may be planarized to expose the top of the pillar 472 at noted at 445. The plate substrate may be bonded to the bonding layer 422 and optionally to the pillar 472 by chemical, atomic and/or adhesive bonding.

At 455 the bonded piezoelectric plate or substrate is then planarized to thickness ts of plate 110 to form plate 410. Planarizing the plate may include thinning the plate by ion slicing, CMP or some other method to polish the plate to a desired thickness of plate 410.

Planarizing at 455 may include planarizing and/or polishing (e.g., by CMP) the piezoelectric substrate to have top surface 419 of plate 410. For example, after the piezoelectric substrate is deposited, the surface of the material of that substrate may be uneven and thus should be planarized. Planarization may be performed by mechanical polishing, by chemical-mechanical polishing (CMP), or some other method. In some cases, planarizing is CMP the material of the piezoelectric substrate until the plate 410 has thickness ts. Thickness ts may be as noted herein.

At 465 holes 342 are etched through planarized piezoelectric plate 410 to form piezoelectric plate 310 and device 407. Device 407 has planarized piezoelectric plate 310 with holes 342 etched through it to surface 418 of bonding layer 422 or optionally to the top surface 412 of pillar 472 (not shown).

While the holes 342 are only shown in cross-section in the figures, it must be understood that each hole 342 is a three-dimensional opening created by removing material from the plate and optionally bonding layer. Openings 342 may have a cross-sectional shape (normal to the plane of the drawing) that is a rectangle, a regular or irregular polygon, oval, or some other shape desired for etching through to form cavity 340.

At 465, plate 410 may be masked and then have holes 342 formed through the mask and plate. At 465, device 406 may have a mask (not shown) formed on top surface 419 of the plate 410; and holes or openings 342 etched through the plate 410 and optionally through the bonding layer 422 at desired locations or areas through which pillar 472 will be etched to form cavity 340 where the pillar was removed.

The mask may be a photoresist mask or a hard mask, and etching may be done using a suitable wet or dry etching process. The openings 342 may be formed using ion milling. In some cases, the etching may be done by an ion milling, a reactive ion etching (RIE), an inductively coupled plasma (ICP) and/or a laser milling process. Other etching processes may be used on the plate wafer.

The etch may be a timed etch that etches through the plate 410 and through the bonding layer 422 when it exists and to or into pillar 472. In another case, etching may be done by one or more selective etches. For example, if the bonding layer does not exist between the plate 410 and pillar 472, the pillar 472 may be used as an etch stop for an etch through the plate 410 that is selective with respect to the mask and pillar material. If the bonding layer does exist between the plate 410 and pillar 472, the bonding layer may be used as an etch stop for a first etch through the plate 410 that is selective with respect to the mask and bonding layer. Then, the pillar 472 may be used as an etch stop for a second etch through the bonding layer with respect to the plate, mask and pillar material.

The bonding layer may be etched by a dry etch oxide or short wet etch such as of hydrofluoric acid (HF) or buffered HF. In some cases, the etching the bonding layer may be done by an ion milling, a reactive ion etching (RIE), an inductively coupled plasma (ICP) and/or a laser milling process.

The pillar 472 may function as a vertical etch-stop under the plate to stop the etching at or just below (e.g., 1-5 percent of the pillar 472 thickness) the top surface 412. It may be an etch stop for etching the plate and/or bonding layer.

At 475 in FIG. 4D one or more conductive patterns are formed on plate 310 to form device 408. Step 475 may be forming at least one conductor pattern on the thinned piezoelectric plate of step 455 or 465. The conductor pattern includes an IDT 330 having interleaved fingers 336. The conductor pattern may be a first metal (M1) layer. Device 408 has IDT 330 formed on the top of plate 310 and second metal (M2) layer 470 formed over part of IDT 310, and passivation layer 427 formed over another part of the IDT 310. Forming the IDT, M2 layer and passivation layer may be device fabrication processing.

A mask may be patterned onto the top surface 419 of plate 310 to form the IDT 130. Forming IDT may include forming conductor patterns and dielectric layers defining one or more XBAR devices on the surface of the piezoelectric plate 310. Typically, a filter device will have an IDT as a first of two or more conductor layers that are sequentially deposited and patterned. The IDT layers may be, for example, aluminum, an aluminum alloy, copper, a copper alloy, molybdenum, tungsten, beryllium, gold, or some other conductive metal. Optionally, one or more layers of other materials may be disposed below (i.e. between the IDT layer and the piezoelectric plate) and/or on top of the IDT. For example, a thin film of titanium, chrome, or other metal may be used to improve the adhesion between the IDT layer and the piezoelectric plate.

The IDT 130 may be formed by depositing the conductor layers over the surface 419 of the piezoelectric plate 310 and removing excess metal by etching through a patterned photoresist that covers areas of the IDT. Alternatively, the IDT may be formed using a lift-off process. Photoresist may be deposited over the piezoelectric plate and patterned to remove areas that leave behind or define the IDT. The IDT material may be deposited in sequence over the surface of the photoresist and piezoelectric plate. The photoresist may then be removed, which removes the excess material, leaving the IDT.

Also, at 445, a second M2 metal layer 470 may be formed on the conductor pattern and/or a passivation layer 427 may be formed on part of the conductor pattern, such as over the diaphragm 315 to be formed later. Second M2 metal layer 470 is electrically conductive material attached to the top of the M1 layers and/or IDT, such as to the top of the busbars and not to the top of the fingers 336. In some cases, the second metal layers 470 are multiple conductive layers formed similar to forming the IDT 130.

Layer 470 may include contact pads for connecting to contact bumps. The contact pads may be for electrically contacting contact bumps that are bonding pads, gold or solder bumps, or other means for making connection between the device 404 (e.g., contact pads, conductor layers or busbars) and external circuitry, such as after step 485.

The material of layer M1 and layer M2 may be a metal or conductor as described for IDT 130. They may be the same material. They may be a different material. They may be formed during one or more different processing steps. These steps may be different than steps for forming the IDT.

Forming passivation layer 427 may include forming one or more dielectric layers on the plate and/or IDT, such as a front side dielectric and/or a passivation layer as noted herein. The passivation layer 419 may include, for example, a dielectric layer selectively formed over the IDTs of shunt resonators to shift the resonance frequency of the shunt resonators relative to the resonance frequency of series resonators as described in U.S. Pat. No. 10,491,192. The different thickness of the dielectric layer may cause the XBAR to be tuned to a selected frequency as compared to the other XBARs. For example, the resonance frequencies of the XBARs in a filter may be tuned using different front-side dielectric layer thickness on some XBARs as compared to others. The passivation layer 427 may include an encapsulation/passivation layer deposited over all or a membrane area of the device. Forming passivation layer 427 may include, for example, depositing an encapsulation/passivation layer such as $SiO_2$ or $Si_3O_4$ over a portion of the device 408. Passivation layer 427 may seal the M1 metal layers (e.g., the IDT and/or fingers) and piezoelectric layers from exposure to air and moisture, such as to avoid damage and rust to the metal. Passivation layer 427 may also provide material that can have a thickness selectively removed to tune the frequency of the filter. In this case, passivation layer 427 may be called the "passivation and tuning layer."

Forming the M1, M2 and passivation layer may each include patterning and fabricating those layers separately. In some cases, the plate 310 is Lithium Niobate (LN) which may be 275 nm thick; the passivation layer 427 is SiO2; the M1 or IDT is Aluminum (Al) metal traces; and the M2 is Gold (Au) contact pads and traces.

At 485 the sacrificial pillar 472 is etched through holes 342 to form air cavity 340 where the pillar was removed, bonding layer 322 and device 409. Step 485 may be removing the polysilicon pillar of step 475 using an etchant introduced through holes 342 in the piezoelectric plate. Device 409 includes diaphragm 315 and air cavity 340 where pillar 472 was removed. Bonding layer 322 has parts of layer 422 removed from under the diaphragm 315 and/or above pillar 472.

Removing the pillar at 485 may be wet or dry etching away material of pillar 472 through openings 342 in the plate. The cavity 340 may be etched by an etch process that etches away all or substantially all of the sacrificial pillar 472 but does not remove any or substantially any of the material of the plate 310, bonding layer 322 or layer 324. Removing sacrificial pillar 472 to form cavities 340 may be performed by selectively etching, dissolving, or some other process that removes pillar 472 with respect to the material of plate 310, bonding layer 322 and layer 324.

The plate 310, bonding layer 322 and TOX layer 342 are substantially impervious to the process and etchant used to form the cavity 340. The material of those layers may be a material is that not etched by the etch process used to etch the sacrificial pillar to form the cavity, or that is etched sufficiently slowly that those layers constrain the lateral and vertical extent of the cavity 340. When the sacrificial pillar 472 is polysilicon, the etchant may be, for example, $XeF_2$. The silicon TOX layer 324 may be, for example, SiOx, such as SiO, $SiO_2$, $SiO_3$, or the like. Different sacrificial materials and different etchants may be used with different bonding layer 322 and TOX layer 342 materials.

In some case, the cavity 340 is formed by etching the sacrificial pillar 472 down to top surface 441 of layer 322 with a selective etchant that reaches the pillar through the openings 342 in the piezoelectric plate 310. The process used to form the cavity 340 may introduce a dry gaseous etchant or a wet etchant such as an HF acid etchant via the openings 342. This etchant will etch isotropically, causing the cavity to expand in all directions from the openings 342. The resulting cavity will effectively increase the area of the diaphragm 315 until it reaches material of layer 322 and TOX layer 324, where the etching will stop which avoids having the etch extend and create a cavity that extends beyond the area occupied by the IDT as shown by the shape of the cavity at 485 and in FIG. 3A.

Consequently, using the sacrificial pillar 472 provides better control of forming the cavity and selection of a predetermined area size and depth for the cavity. It also allows forming of a smaller cavity than other processes such as backside etching for FIG. 1.

In some cases, the cavity 340 has a length L of between 50 um and 500 um; and width of between 20 um and 200 um. In some cases, cavity depth of between 2 and 50 microns. The cavity depth can be sufficiently deep that the XBAR membrane cannot "bottom out" and touch the substrate in the cavity.

Selecting polysilicon as the sacrificial pillar 472 is of significant benefit in terms of etch selectivity, in that etch chemistry that is selective to polysilicon over, SiO2 as bonding layer 322 and silicon TOX as layer 324 is much more common than, for example, than an etch chemistry that is selective phosphosilicate glass (PSG) over SiO2.

Also, using the polysilicon as sacrificial pillar 472 provides better control of forming the cavity and selection of a predetermined area size and depth for the cavity. It also allows forming of a smaller cavity than other processes such as some of those for FIG. 1. For example, by using polysilicon as the sacrificial layer, SiO2 as bonding layer 322 and silicon TOX as layer 324, a wet etch chemistry (or process) that can etch the, SiO2 as bonding layer 322 and silicon TOX as layer 324 is not required to form the cavities 340 and/or release the resonator membrane. Some other approaches for 'frontside' etching of resonator cavities require membranes that are much larger than the desired size. Using a predefined area for pillar 472 that is filled with a sacrificial material (e.g., polysilicon), allows the resonator membrane size over the cavities 340 to be drastically reduced, and fabrication steps to be significantly simplified.

A separate cavity may be formed for each resonator 380 and 390 in a filter device such as device 370.

The filter or XBAR device may be completed at 495. Actions that may occur at 495 include depositing further metal layers and/or bonding device 409 to another device, package or PCB. Actions that occur at 495 may also include forming solder bumps or other means for making connection between the device 409 and external circuitry; excising individual devices from a wafer containing multiple devices; other packaging steps; and testing. Another action that may occur at 495 is to tune the resonant frequencies of the resonators within a filter device by adding or removing metal or dielectric material from the front side of the device shown in 406. After the filter device is completed, the process ends at 495. Any number of FIGS. 1-3C may show examples of the XBAR device or resonator after completion at 495. Thus, process 400 forms improved XBAR resonators or filters using fabrication techniques using a sacrificial polysilicon pillar 472 process that allows a frontside membrane release of the plate 310 from a substrate 320 when forming a cavity 340 under the plate.

Problems solved by process 400 use a frontside membrane release (FSMR) of the piezoelectric plate process to provide a lower cost, more controllable approach for forming XBAR devices as compared to a backside membrane release (BSMR) process. The polysilicon pillar fabrication method of process 400 enables the formation of sacrificial polysilicon pillars on the frontside of the wafer, which can then be removed with a frontside piezoelectric membrane release process to create the air cavity. For instance, a BSMR method may use a deep reactive ion etching technique to remove the Si substrate 120 underneath the LN membrane 110 and the etching time increases with Si substrate thickness. The FSMR of process 400 eliminates the BSMR etch processing and thus eliminates the BSMR need for more etchant and/or etch time.

It is also noted that other FSMR techniques require: 1) sacrificial cavity material which will need to be etched away at a later process step, and 2) a buried oxide layer to form an adhesion layer between the LN substrate and Si substrate. On the other hand, the polysilicon pillar method of uses a sacrificial cavity pillar material 472 for the FSMR process 400.

It is also noted that other FSMR techniques on pre-patterned Si substrates utilize air cavities below and require frontside device fabrication on thin LN plates which poses a high risk due to the fragility of the thin LN plate because the frontside processing can crack and/or damage the thin LN plate. The process 400 uses a sacrificial polysilicon pillar and an LN thinning approach at step 455 that mitigates this cracking risk by providing an underlying support structure of bonding layer 422 and pillar 472 for the LN plate during the device processing at 475 as shown. Thus, the frontside processing to form conductor layers and dielectric layers at 427 will not crack and/or damage the thin LN plate 310 because the pillar 472 will support the plate 310, instead of the plate being suspended over air or a layer that is not a thick handle wafer.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A method comprising:
   forming a polysilicon pillar on a dielectric layer attached to a substrate;
   depositing a blanket dielectric layer on the polysilicon pillar and on a portion of the dielectric layer to bury the polysilicon pillar between the dielectric layer and the dielectric blanket layer by forming the dielectric blanket layer on both a top surface of the polysilicon pillar and side surfaces of polysilicon pillar;
   planarizing the surface of the blanket dielectric layer;
   bonding a piezoelectric layer to the planarized surface of the blanket dielectric layer;
   thinning the piezoelectric layer to a target piezoelectric membrane thickness;
   forming at least one conductor pattern on the thinned piezoelectric layer; and
   removing the polysilicon pillar using an etchant introduced through holes in the piezoelectric layer to form a cavity between the dielectric blanket layer and the dielectric layer.

2. The method of claim 1, wherein:
   the substrate includes a thermal oxide (TOX) top layer that the blanket dielectric layer is formed on; and
   forming the pillar includes blanket layering pillar material on the TOX layer, patterning a top of the blanket layer of pillar material and etching through the top of the blanket layer to remove areas of the blanket layer pillar material to the TOX layer to leave the pillar.

3. The method of claim 2, wherein:
   the substrate is a polymorphic or crystalline silicon (Si) material having a thickness of 250-500 μm;
   the polysilicon pillar is a sacrificial tub in the dielectric layer and has a thickness between 1 and 5 μm;
   the dielectric layer is an SiO$_2$ layer having a thickness between 3 and 5 μm; and
   the TOX layer is a thermal oxide layer having a thickness between 1 and 5 μm.

4. The method of claim 1, wherein removing the polysilicon pillar includes front-side etching the polysilicon pillar through the holes in the piezoelectric layer to form the cavity where the polysilicon pillar is removed and frontside releasing a piezoelectric membrane of the piezoelectric layer to form a diaphragm over the etched cavity.

5. The method of claim 4, wherein removing the polysilicon pillar includes front side releasing a portion of the piezoelectric layer over the cavity to form a diaphragm spanning the cavity.

6. The method of claim 5, wherein the at least one conductor pattern includes an interdigital transducer (IDT) with interleaved fingers disposed on the diaphragm spanning the cavity.

7. The method of claim 6, further comprising:
   configuring the piezoelectric layer and the IDT such that radio frequency signals applied to the IDT excite a primary shear acoustic mode in the piezoelectric layer over the cavity; and
   selecting a thickness of the diaphragm to tune the primary shear acoustic mode in the piezoelectric layer.

8. The method of claim 1, wherein the substrate is Si, the dielectric layer is SiO$_2$, the IDT is metal, and the piezoelectric layer is one of lithium niobate or lithium tantalate.

9. The method of claim 1, wherein prior to removing the polysilicon pillar, a top surface of the dielectric layer has a thickness between 0.05 μm and 1.0 μm above the top of the polysilicon pillar; and wherein removing the polysilicon pillar includes removing the thickness of between 0.05 μm and 1.0 μm of the dielectric layer.

10. The method of claim 1, wherein forming the polysilicon pillar includes blanket layering pillar material on a TOX layer, patterning a top of the blanket layer of pillar material and etching through the top of the blanket layer to remove areas of the blanket layer of pillar material to the TOX layer; and
    wherein removing the blanket layer of pillar material comprises etching away the pillar material with a selective etchant that etches the pillar material through the holes in the thinned piezoelectric layer but does not etch the piezoelectric layer, the dielectric layer or the TOX layer.

11. A method comprising:
    blanket layering a pillar material on a dielectric layer attached to a substrate;
    patterning a top of the pillar material and etching through the patterned top to remove areas of the blanket layer of pillar material to leave a pillar of the pillar material;
    depositing a blanket dielectric layer on the pillar and on a portion of the dielectric layer to bury the pillar between the dielectric layer and the blanket dielectric layer by forming the blanket dielectric layer on both a top surface of the pillar and side surfaces of pillar;
    planarizing the surface of the blanket dielectric layer;
    bonding a piezoelectric layer to the planarized surface of the blanket dielectric layer;
    forming a conductor pattern on the piezoelectric layer; and
    removing the pillar through holes in the piezoelectric layer to form a cavity where the pillar was removed and between the dielectric blanket layer and the dielectric layer.

12. The method of claim 11, wherein removing pillar includes front-side etching the pillar through the holes in the piezoelectric layer to form the cavity where the pillar is removed, to frontside release a piezoelectric membrane of the piezoelectric layer to form a diaphragm over the etched cavity, and to form diaphragm spanning the cavity.

13. The method of claim 11, wherein the conductor pattern includes an interdigital transducer (IDT) with interleaved fingers disposed on the diaphragm spanning the cavity.

14. The method of claim 13, further comprising:
    configuring the piezoelectric layer and the IDT such that radio frequency signals applied to the IDT excite a primary shear acoustic mode in the piezoelectric layer over the cavity; and
    selecting a thickness of the diaphragm to tune the primary shear acoustic mode in the piezoelectric layer.

15. The method of claim 13, wherein the substrate is a polymorphic or crystalline silicon (Si) material having a thickness of 250-500 μm;
    the pillar is polysilicon and has a thickness between 1 and 5 μm;
    the dielectric layer has a thickness between 3 and 5 μm; and
    the IDT is metal, and
    the piezoelectric layer is one of lithium niobate or lithium tantalate having a thickness between 150 and 1000 nm.

16. A method comprising:

blanket layering a pillar material on a dielectric layer attached to a substrate;

masking a top of the blanket layer of pillar material;

etching through the mask to remove areas of the blanket layer pillar material to leave a pillar of the pillar material;

depositing a blanket dielectric layer on the pillar and on a portion of the dielectric layer to bury the pillar between the dielectric layer and the dielectric blanket layer by forming the dielectric blanket layer on both a top surface of the pillar and side surfaces of polysilicon pillar;

planarizing the surface of the blanket dielectric layer;

bonding a piezoelectric layer to the planarized surface of the blanket dielectric layer;

thinning the piezoelectric layer to a target piezoelectric membrane thickness;

forming at least one conductor pattern on the thinned piezoelectric layer; and removing the polysilicon pillar using an etchant introduced through openings in the piezoelectric layer to form a cavity between the dielectric blanket layer and the dielectric layer.

17. The method of claim 16, wherein thinning the piezoelectric layer comprises forming the openings extending through the thinned piezoelectric layer.

18. The method of claim 17, wherein forming the cavity comprises etching the cavity through the openings to a TOX layer of the substrate to remove all of the pillar from below a location for the diaphragm and to sides of the dielectric layer to form the diaphragm.

19. The method of claim 18, wherein etching the cavity through the openings comprises using a selective etch to etch the cavity in the substrate with respect to the piezoelectric layer, the TOX layer and the dielectric layer.

20. The method of claim 17, wherein forming openings includes:

patterning a top surface of piezoelectric layer; and etching the patterned piezoelectric layer to remove areas of the piezoelectric layer to create openings for etching a cavity.

\* \* \* \* \*